US010163823B2

United States Patent
Tseng et al.

(10) Patent No.: US 10,163,823 B2
(45) Date of Patent: *Dec. 25, 2018

(54) METHOD AND APPARATUS OF ESD PROTECTION IN STACKED DIE SEMICONDUCTOR DEVICE

(71) Applicant: Taiwan Semiconductor Manufacturing Company, Ltd., Hsin-Chu (TW)

(72) Inventors: Jen-Chou Tseng, Jhudong Township (TW); Tzu-Heng Chang, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 348 days.

This patent is subject to a terminal disclaimer.

(21) Appl. No.: 15/094,846

(22) Filed: Apr. 8, 2016

(65) Prior Publication Data
US 2016/0225727 A1 Aug. 4, 2016

Related U.S. Application Data

(63) Continuation of application No. 13/907,444, filed on May 31, 2013, now Pat. No. 9,362,252.
(Continued)

(51) Int. Cl.
*H01L 23/60* (2006.01)
*H01L 23/498* (2006.01)
(Continued)

(52) U.S. Cl.
CPC ........ *H01L 23/60* (2013.01); *H01L 23/49838* (2013.01); *H01L 24/81* (2013.01);
(Continued)

(58) Field of Classification Search
CPC ......... H01L 23/60; H01L 24/02; H01L 24/13; H01L 24/16; H01L 24/81; H01L 25/0652;
(Continued)

(56) References Cited

U.S. PATENT DOCUMENTS 6,724,603 B2 4/2004 Miller et al.
7,593,202 B2 9/2009 Khazhinsky et al.
(Continued)

FOREIGN PATENT DOCUMENTS

KR 20080016783 A 2/2008
KR 20090051771 A 5/2009
(Continued)

*Primary Examiner* — Kevin J Comber
(74) *Attorney, Agent, or Firm* — Slater Matsil, LLP

(57) ABSTRACT

An apparatus includes an interposer and a plurality of dies stacked on the interposer. The interposer includes a first conductive network of a first trigger bus. Each of the plurality of dies includes a second conductive network of a second trigger bus, and an ESD detection circuit and an ESD power clamp electrically connected between a first power line and a second power line, and electrically connected to the second conductive network of the second trigger bus. The second conductive network of the second trigger bus in each of the plurality of dies is electrically connected to the first conductive network of the first trigger bus. Upon receiving an input signal, the ESD detection circuit is configured to generate an output signal to the corresponding second conductive network of the second trigger bus to control the ESD power clamps in each of the plurality of dies.

20 Claims, 5 Drawing Sheets

Related U.S. Application Data

(60) Provisional application No. 61/780,330, filed on Mar. 13, 2013.

(51) Int. Cl.
*H01L 25/00* (2006.01)
*H01L 25/065* (2006.01)
*H01L 27/02* (2006.01)
*H01L 23/00* (2006.01)

(52) U.S. Cl.
CPC ...... *H01L 25/0652* (2013.01); *H01L 25/0657* (2013.01); *H01L 25/50* (2013.01); *H01L 27/0292* (2013.01); *H01L 24/02* (2013.01); *H01L 24/05* (2013.01); *H01L 24/13* (2013.01); *H01L 24/16* (2013.01); *H01L 25/0655* (2013.01); *H01L 2224/023* (2013.01); *H01L 2224/0401* (2013.01); *H01L 2224/131* (2013.01); *H01L 2224/16145* (2013.01); *H01L 2224/16225* (2013.01); *H01L 2224/16227* (2013.01); *H01L 2924/1305* (2013.01)

(58) Field of Classification Search
CPC ........... H01L 25/0655; H01L 2224/023; H01L 2224/0401; H01L 2224/131; H01L 2224/16145; H01L 2224/1627; H01L 2924/00; H01L 2924/00014; H01L 2924/1305; H01L 2924/16145; H01L 2924/16227
USPC .......................................................... 361/56
See application file for complete search history.

(56) References Cited

U.S. PATENT DOCUMENTS

| | | |
|---|---|---|
| 8,050,003 B2 | 11/2011 | Kwak |
| 2005/0078419 A1 | 4/2005 | Stockinger et al. |
| 2006/0181823 A1 | 8/2006 | Miller et al. |
| 2008/0062596 A1 | 3/2008 | Miller et al. |
| 2011/0031598 A1 | 2/2011 | Lee et al. |
| 2012/0068360 A1 | 3/2012 | Best |
| 2013/0009278 A1 | 1/2013 | Lee |
| 2013/0037934 A1 | 2/2013 | Lin et al. |
| 2013/0063843 A1 | 3/2013 | Chen et al. |
| 2014/0126089 A1 | 5/2014 | Chang et al. |
| 2014/0268448 A1 | 9/2014 | Tseng et al. |

FOREIGN PATENT DOCUMENTS

| | | |
|---|---|---|
| KR | 101110942 B1 | 3/2012 |
| KR | 20130004783 A | 1/2013 |

METHOD AND APPARATUS OF ESD PROTECTION IN STACKED DIE SEMICONDUCTOR DEVICE

RELATED CASES

The present application claims priority to U.S. patent application Ser. No. 13/907,444, filed May 31, 2013, entitled "Method and Apparatus of ESD Protection in Stacked Die Semiconductor Device," which Application claims priority to U.S. Provisional Patent Application No. 61/780,330, filed Mar. 13, 2013, entitled "Method and Apparatus of ESD Protection in Stacked Die Semiconductor Device," which applications are incorporated herein by reference.

FIELD OF DISCLOSURE

The present disclosure is related to semiconductor integrated circuits (IC) and, more particularly, to electrostatic discharge (ESD) protection of stacked die semiconductor device.

BACKGROUND

The trend in VLSI technology has resulted in narrower interconnection lines and smaller contacts. Furthermore, integrated circuit designs are becoming more complex and denser. More devices are compressed in integrated circuits to improve performance. As a result, integrated circuits become more susceptible and vulnerable to ESD (electrostatic discharge) events causing the circuits to fail.

Static electricity exists on the surfaces of many materials. When bodies of materials with different potential come into contact, ESD will occur. ESD is generally defined as a sudden and momentary electric current that flows between two objects at different electrical potentials. An ESD circuit provides an ESD current path for an ESD current associated with an ESD event. In this way, an ESD circuit mitigates ESD current from entering circuitry associated with a device. ESD can damage devices fabricated on IC chips causing performance degradation or failures.

One of many considerations for IC design is on-chip ESD protection. Due to the ever-increasing requirements for higher speeds, smaller devices and product reliability, the significance of on-chip ESD protection is critical in IC design.

DETAILED DESCRIPTION

Figure 1:
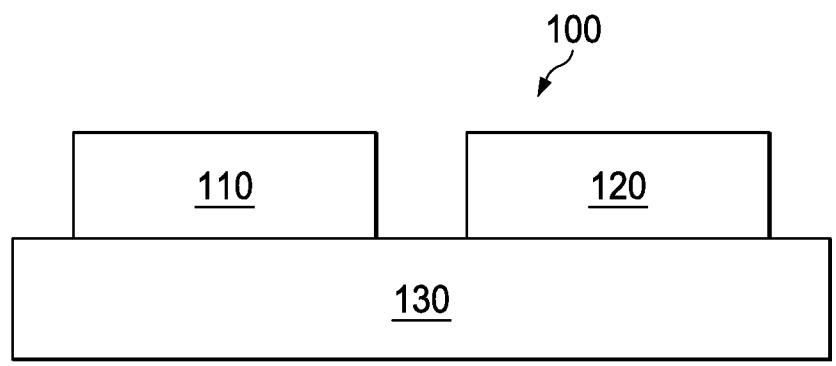
FIG. 1 is a block diagram of a die stack 100 in accordance with some embodiments.

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

FIG. 1 is a block diagram of a die stack 100 according to some example embodiments. The die stack 100 includes dies 110, 120 and an interposer 130. In some embodiments, each of dies 110 and 120 is symmetrically and/or asymmetrically stacked on the interposer 130, either on the same side or on the different side of the interposer 130. In some embodiments, the dies 110 and 120 are heterogeneous dies. In some other embodiments, the dies 110 and 120 are homogeneous dies. In some embodiments, the interposer 130 provides connections between the die stack 100 and external I/Os. In some embodiments, the interposer 130 is formed of materials such as semiconductor materials, dielectric materials, or the like. In various embodiments, the interposer 130 is a PCB board, an integrated circuit carrier board, or any other chips with a plurality of specific functionalities. Although FIG. 1 only shows two dies 110 and 120 stacked on the interposer 130, any number of dies is within the scope of various embodiments. In some embodiments, the interposer 130 includes passive devices. In some embodiments, the interposer 130 includes active devices.

When an ESD event occurs, the discharge current may go through different dies in the die stack 100. For example, an ESD discharge current goes through an external I/O (not shown) in the interposer 130, the die 110, an interconnection (not shown) in the interposer 130, the die 120, and then to another external I/O (not shown) in the interposer 130. All devices, circuitry and components in the dies 110, 120 and the interposer 130 may be damaged by this ESD discharge current. Each of the dies 110, 120 and the interposer 130 includes corresponding ESD protection devices as described in following embodiments, and these ESD protection devices in the corresponding dies 110, 120 and the interposer 130 are triggered simultaneously to protect against the ESD event and current.

Figure 2A:
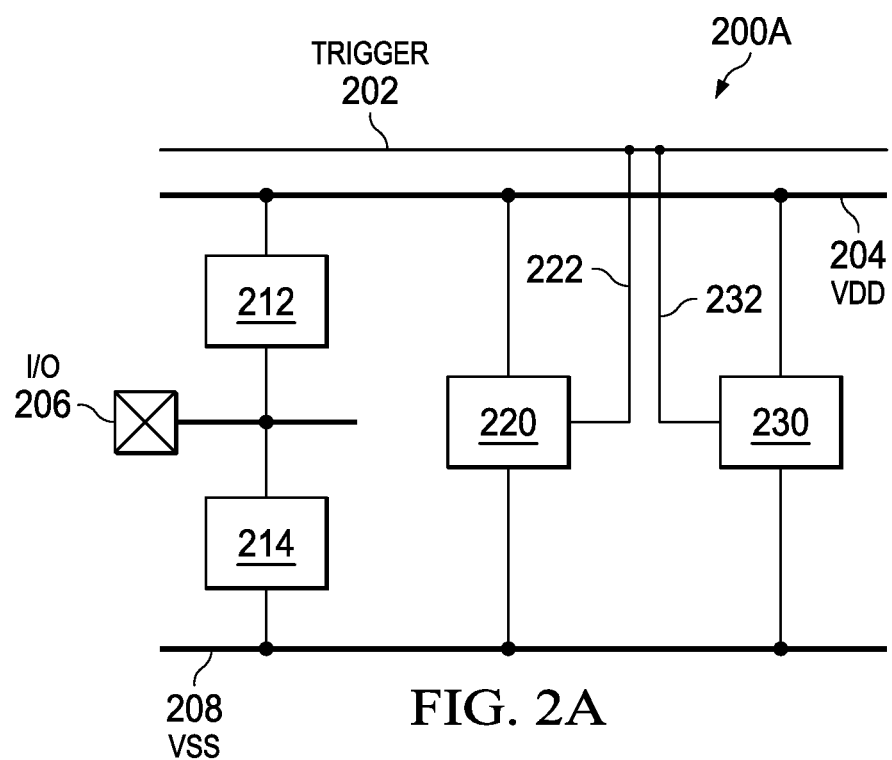
FIG. 2A is a schematic view of ESD protection circuitry 200A used in dies 110, 120 and/or the interposer 130 in accordance with some embodiments.

FIG. 2A is a schematic view of an ESD protection circuitry 200A used in dies 110, 120 and/or the interposer 130 according to some example embodiments. FIG. 2A is a schematic view using standard block depictions for components. The ESD protection circuitry 200A includes a VDD 204, a VSS 208, an I/O port 206 and a trigger bus 202. The ESD protection circuitry 200A also includes ESD clamps 212 and 214, an ESD detection circuit 220 and an ESD power clamp 230.

ESD clamps 212 and 214 coupled between the VDD 204 and the VSS 208, with an I/O port 206 coupled therebetween. The ESD clamps 212 and 214 are configured to provide an input/output (I/O) signal ESD protection circuit. The ESD detection circuit 220 couples between the VDD 204 and the VSS 208. The ESD detection circuit 220 outputs an ESD trigger signal 222 to the trigger bus 202. When an ESD event is detected on the VDD 204 or the VSS 208, the ESD detection circuit 220 pulls the trigger bus 202 to an active potential, for example, a VDD potential. Any number of ESD detection circuits 220 can be included and coupled between the VDD 204 and the VSS 208, and are not shown in FIG. 2A for simplicity purpose.

The ESD power clamp 230 couples between the VDD 204 and the VSS 208. The ESD power clamp 230 receives a trigger input 232 from the trigger bus 202. When a potential of the trigger bus 202 is an active potential, the ESD power clamp 230 turns on to discharge ESD current from the VDD 204 to the VSS 208. Any number of ESD power clamp 230 can be included and coupled between the VDD 204 and the VSS 208, and are not shown in FIG. 2A for simplicity purpose.

In some embodiments, the trigger bus 202 is implemented as any type of conductive network. The conductive network includes a plurality of conductive connections. The plurality of conductive connections are electrically connected or intersected with others. In such a situation, parasitic resistance of the trigger bus 202 is reduced. For example, the conductive network of the trigger bus 202 is implemented as a mesh type network or a stripe type network. In some embodiments, the conductive network of the trigger bus 202 is formed by metal lines, conductive vias, oxide definition (OD), polysilicon (POLY), redistribution layer (RDL), or other suitable conductive lines. One or more ESD detection circuits 220 and one or more ESD power clamps 230 coupled between the VDD 204 and the VSS 208 are electrically connected to the conductive network of the trigger bus 202. When one or more of the ESD detection circuits 220 detect an ESD event on the VDD 204 or the VSS 208, the conductive network of the trigger bus 202 is pulled to an active potential, for example, a VDD potential. As a result, all of the ESD power clamps 230 coupled between the VDD 204 and the VSS 208 are triggered substantially at the same time and turn on substantially at the same time to discharge ESD current from the VDD 204 to the VSS 208.

Figure 2B:
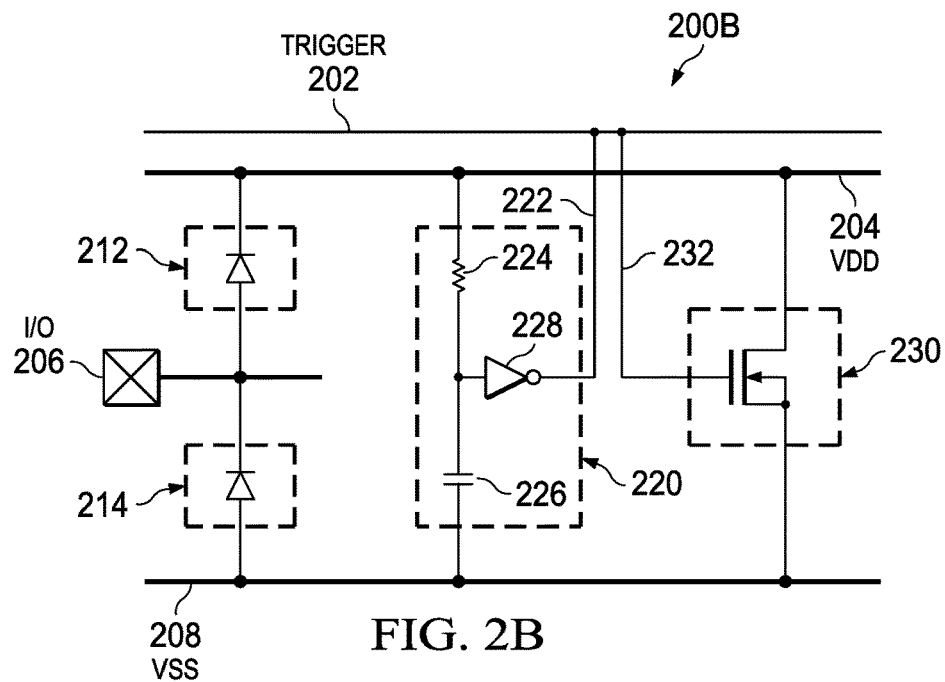
FIG. 2B is a schematic view of ESD protection circuitry 200B in accordance with some embodiments.

FIG. 2B is a schematic view of an ESD protection circuitry 200B according to some example embodiments. The ESD protection circuitry 200B is an example embodiment of the schematic view of the ESD protection circuitry 200A. The ESD protection circuitry 200B includes similar components and structures as the corresponding ones in FIG. 2A. In some embodiments, the ESD clamps 212 and 214 each include a diode to discharge ESD current from I/O port to the VDD 204 or the VSS 208. In some embodiments, the ESD detection circuit 220 includes a resistor 224, a capacitor 226 and an inverter gate 228. In some embodiments, the capacitor 226 is replaced by a series of diodes (not shown). When an ESD event occurs on the VDD 204, an input voltage of the inverter gate 228 is at low potential because of an RC effect on the resistor 224 and the capacitor 226. The trigger bus 202 is pulled to an active potential, for example, a VDD potential. In some embodiments, the ESD power clamp 230 includes an NMOS transistor. When a potential of the trigger bus 202 is at an active potential, for example, VDD potential, the NMOS transistor is turned on to discharge ESD current from VDD 204 to VSS 208. In some embodiments, the ESD power clamp 230 includes a series of bipolar transistors in PNPN arrangement (not shown). In some embodiments, the ESD power clamp 230 includes a NPN bipolar transistor (not shown).

Figure 3:
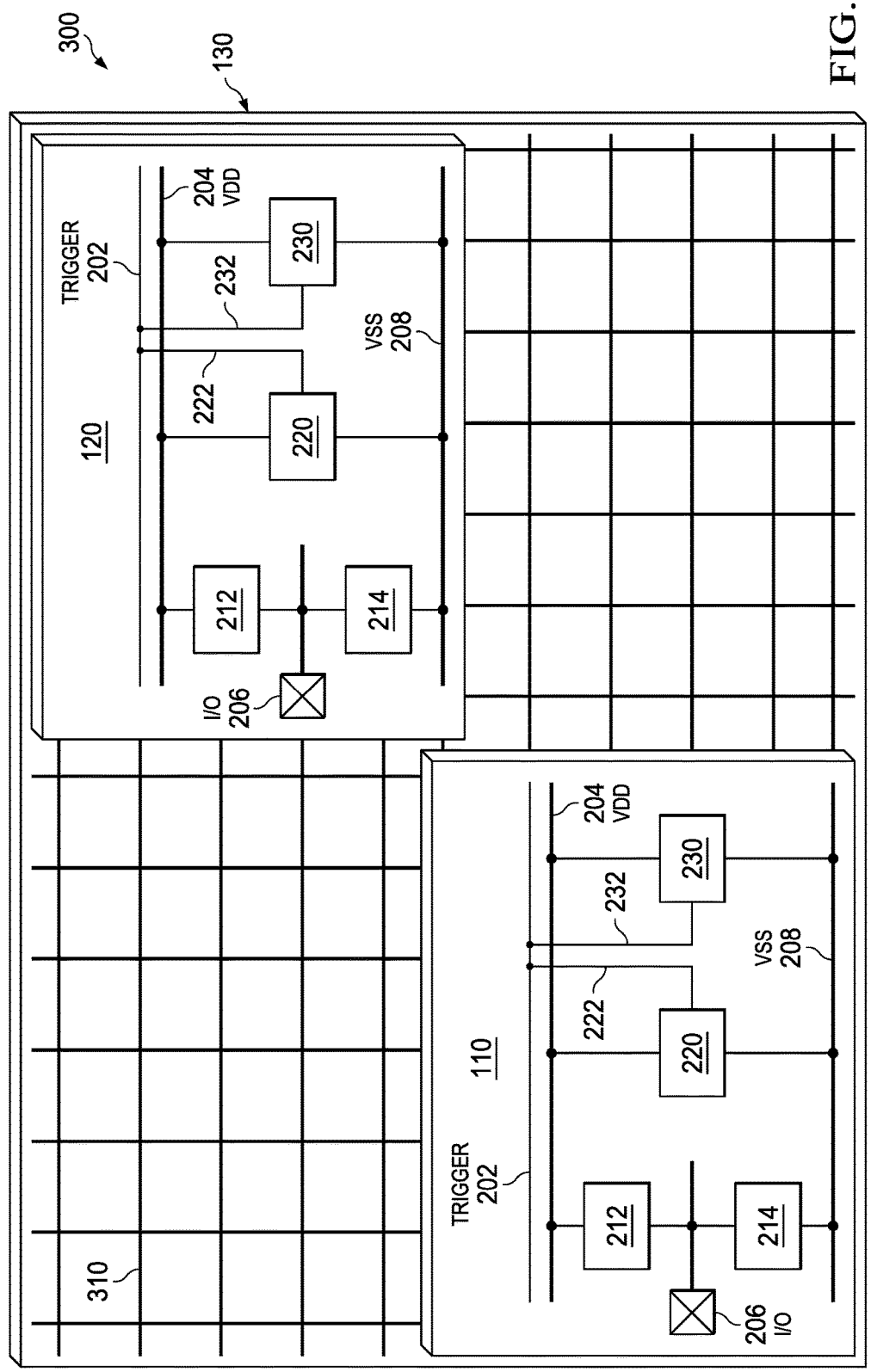
FIG. 3 is a schematic view of the die stack 300 in accordance with some embodiments.

FIG. 3 is a schematic view of a die stack 300 according to some example embodiments. FIG. 3 is a plan view of the die stack 100 in FIG. 1. The die stack 300 includes similar components and structure of dies 110, 120 and the interposer 130 as the corresponding ones in FIG. 1. The dies 110 and 120 are stacked on the interposer 130. Each of the dies 110, 120 includes the ESD protection circuitry 200A as shown in FIG. 2A. In some embodiments, the interposer 130 also includes one or more ESD protection circuitry 200A in FIG. 2A but is not shown in the interposer 130 in FIG. 3 for simplicity purpose.

In some embodiments, the interposer 130 includes a conductive network 310. The conductive network 310 includes a plurality of conductive connections. The plurality of conductive connections are electrically connected or intersected with others. In such a situation, parasitic resistance of the conductive network 310 is reduced. Although the conductive network 310 is implemented as a conductive mesh in the interposer 130 in FIG. 3, other type of conductive networks to reduce parasitic resistance are within the scope of various embodiments. In some embodiments, the conductive network 310 is a stripe type network. In some embodiments, the conductive network 310 is formed by metal lines, conductive vias, oxide definition (OD), polysilicon (POLY), redistribution layer (RDL), or other suitable conductive lines.

In some embodiments, the conductive networks of the trigger buses 202 of the corresponding dies 110 and 120 are electrically connected to the conductive network 310 in the interposer 130 through conductive connections such as metal lines, conductive vias, oxide definition (OD), polysilicon (POLY), redistribution layer (RDL), TSV (through substrate via), bump pads, solder balls, or other suitable means. In some embodiments, the interposer 130 includes one or more ESD protection circuitries 200A in FIG. 2A. One or more ESD detection circuits 220 and one or more ESD power clamps 230 of the one or more ESD protection circuitries 200A in the interposer 130 are then electrically connected to the conductive network 310.

When an ESD event occurs on any one of the I/O ports 206 in the dies 110, 120 or the interposer 130, the corresponding ESD current is discharged through the ESD clamp 212 or the ESD clamp 214 to the VDD 204 or the VSS 208 in the corresponding dies 110, 120 or the interposer 130. When one or more of the ESD detection circuits 220 in the dies 110, 120 and the interposer 130 detect an ESD event on the corresponding VDD 204 or the VSS 208, the conductive networks of the trigger buses 202 in the dies 110, 120 and the conductive network 310 in the interposer 130 are pulled substantially at the same time to an active potential, for example, a VDD potential. As a result, all of the ESD power clamps 230 coupled to the conductive networks of the trigger buses 202 in the dies 110, 120 and the conductive network 310 in the interposer 130 are triggered substantially at the same time and turn on substantially at the same time to discharge ESD current from the corresponding VDD 204 to the VSS 208 in the respective dies.

Figure 4:
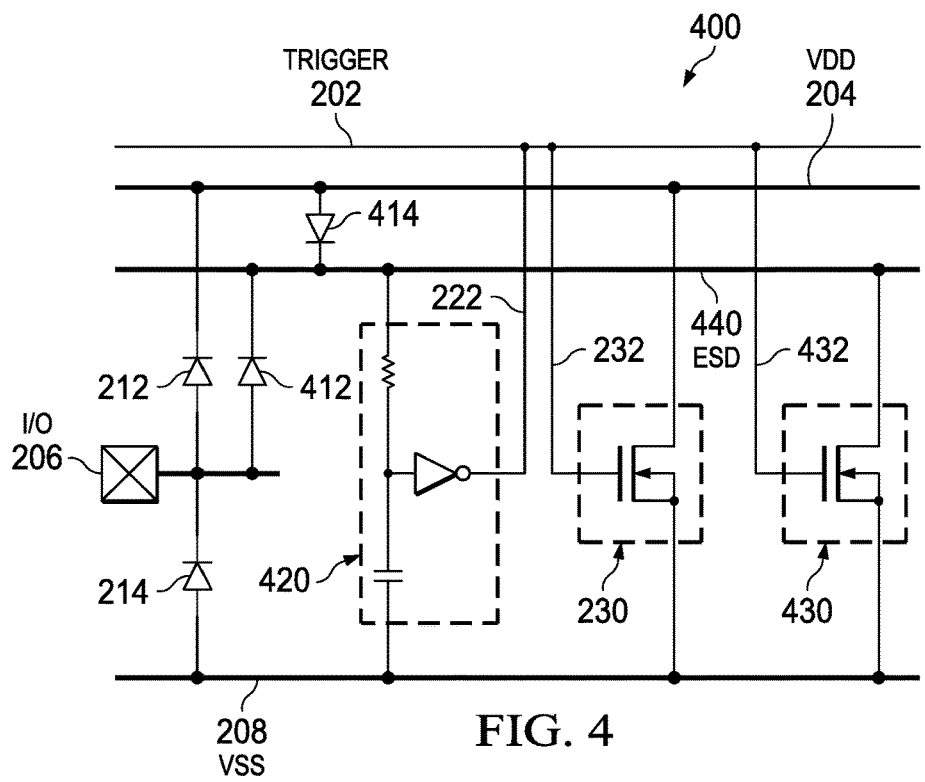
FIG. 4 is a schematic view of ESD protection circuitry 400 in accordance with some embodiments.

FIG. 4 is a schematic view of ESD protection circuitry 400 according to some example embodiments. The ESD protection circuitry 400 includes similar components of ESD clamps 212, 214, the ESD power clamp 230, the trigger bus 202, the VDD 204, the I/O port 206 and the VSS 208 as the corresponding ones in FIGS. 2A and 2B. The ESD protection circuitry 400 also includes ESD clamps 412, 414, an ESD detection circuit 420, an ESD power clamp 430 and an ESD bus 440. The ESD bus 440 is arranged to prevent leakage when a voltage of I/O port 206 is higher than a voltage of the VDD 204. Any number of ESD detection circuits 420 and ESD power clamps 430 can be included and coupled between the ESD bus 440 and the VSS 208, and are not shown in FIG. 4 for simplicity purpose. The ESD detection circuits 420 include components similar to those of the ESD protection circuits 220 in FIG. 2B. The ESD power clamps 430 include components similar to those of the ESD power clamps 230 in FIG. 2B.

When an ESD event occurs on the I/O 206, an ESD current is discharged through the ESD clamp 212, the VDD 204, the ESD clamp 414 to the ESD bus 440. The ESD current is further discharged through the ESD clamp 412 to the ESD bus 440. The ESD detection circuit 420 coupled between the ESD bus 440 and the VSS 208 detects the ESD current, and pulls the trigger bus 202 to an active potential, for example, a VDD potential. The active potential on the trigger bus 202 triggers the ESD power clamp 230 coupled between the VDD 204 and the VSS 208, and triggers the ESD power clamp 430 coupled between the ESD bus 440 and the VSS 208. As a result, the ESD current on the VDD 204 and/or the ESD bus 440 is discharged through the ESD power clamp 230 and/or the ESD power clamp 430 to the VSS 208.

In some embodiments, the trigger bus 202 is implemented as a conductive network as the corresponding one described in FIG. 2A. One or more ESD detection circuits 420 and one or more ESD power clamps 230, 430 are electrically connected to the conductive network of the trigger bus 202, but only one ESD detection circuit 420, one ESD power clamp 230 and one ESD power clamp 430 are shown in FIG. 4 for simplicity purpose.

In some embodiments, the ESD bus 440 is implemented as any type of conductive network. The conductive network includes a plurality of conductive connections. The plurality of conductive connections are electrically connected or intersected with others. In such a situation, parasitic resistance of the ESD bus 440 is reduced. For example, the conductive network of the ESD bus 440 is implemented as a mesh type network or a stripe type network. In some embodiments, the conductive network is formed by metal lines, conductive vias, oxide definition (OD), polysilicon (POLY), redistribution layer (RDL), or other suitable conductive lines. One or more ESD detection circuits 420 and one or more ESD power clamps 430 coupled between the ESD bus 440 and the VSS 208 are electrically connected to the conductive network of ESD bus 440. When one or more of the ESD detection circuits 420 detect an ESD event on the ESD bus 440 or the VSS 208, the trigger bus 202 is pulled to an active potential, for example, a VDD potential. As a result, all of the ESD power clamps 430 coupled between the ESD bus 440 and the VSS 208 are triggered substantially at the same time and turn on substantially at the same time to discharge ESD current from the ESD bus 440 to the VSS 208.

Figure 5:
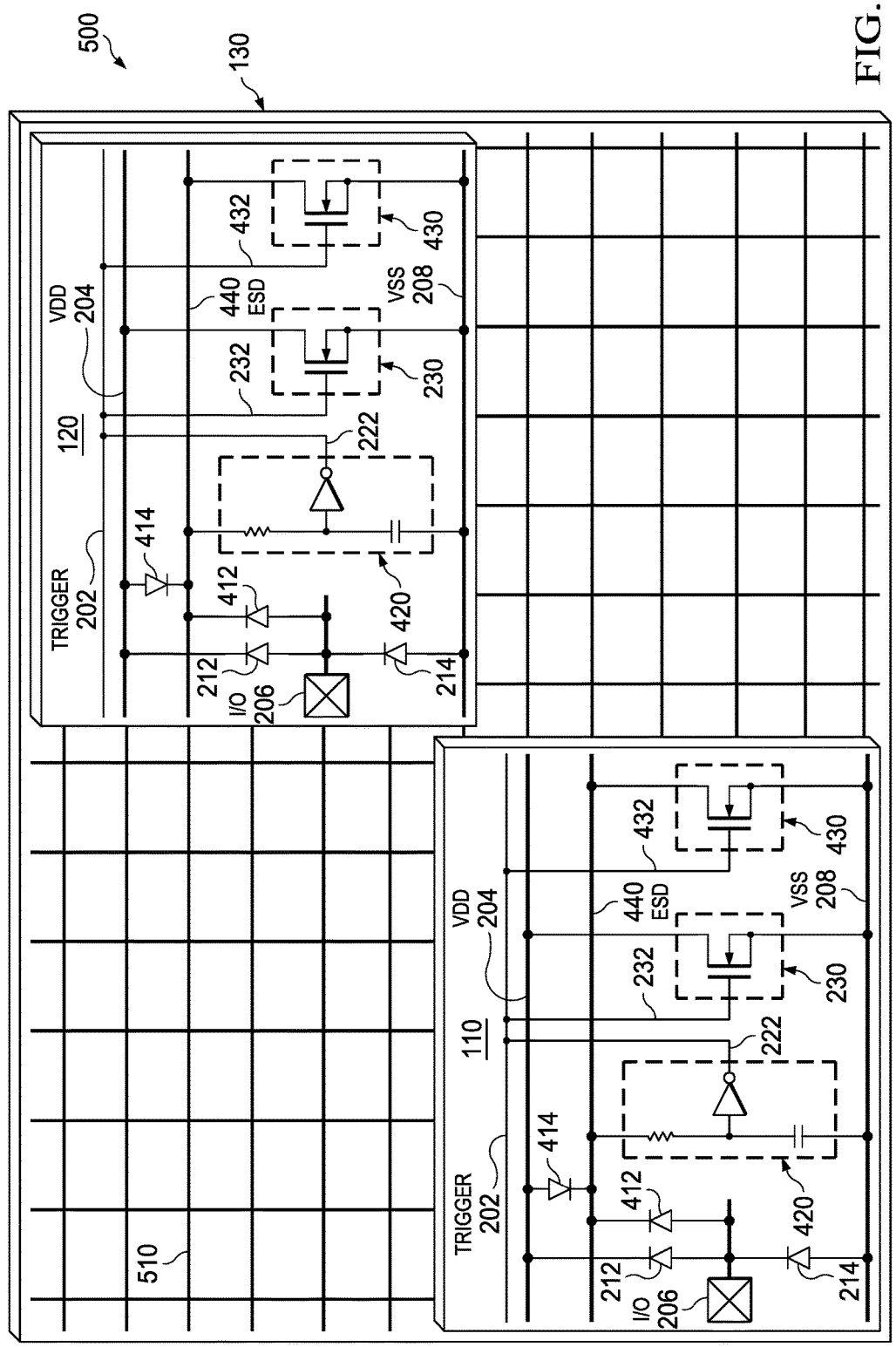
FIG. 5 is a schematic view of the die stack 500 in accordance with some embodiments.

FIG. 5 is a schematic view of the die stack 500 according to some example embodiments. FIG. 5 is a plan view of the die stack 100 in FIG. 1. The die stack 500 includes similar components and structure of dies 110, 120 and the interposer 130 as the corresponding ones in FIG. 1. The dies 110 and 120 are stacked on the interposer 130. Each of the dies 110, 120 include the ESD protection circuitry 400 as shown in FIG. 4. In some embodiments, the interposer 130 also includes one or more ESD protection circuitry 400 in FIG. 4 but is not shown in the interposer 130 in FIG. 5 for simplicity purpose.

In some embodiments, the interposer 130 includes a conductive network of trigger bus that is similar to the conductive network 310 in FIG. 3 and is not shown in FIG. 5 for simplicity purpose.

In some embodiments, the interposer 130 includes a conductive network 510. The conductive network 510 includes a plurality of conductive connections. The plurality of conductive connections are electrically connected or intersected with others. In such a situation, parasitic resistance of the conductive network 510 is reduced. Although the conductive network 510 is implemented as a conductive mesh in the interposer 130 in FIG. 5, other type of conductive networks to reduce parasitic resistance are within the scope of various embodiments. In some embodiments, the conductive network 510 is formed by metal lines, conductive vias, oxide definition (OD), polysilicon (POLY), redistribution layer (RDL), or other suitable conductive line.

The conductive networks of the ESD buses 440 in FIG. 4 of the corresponding dies 110 and 120 are electrically connected to the conductive network 510 in the interposer 130 through conductive connections such as metal lines, conductive vias, oxide definition (OD), polysilicon (POLY), redistribution layer (RDL), TSV (through substrate via), bump pads solder balls (not shown), or other suitable means. In such a situation, the parasitic resistance is reduced in the conductive networks of the ESD buses 440 in FIG. 4 of the corresponding dies 110, 120 and the interposer 130. In some embodiments, the interposer 130 includes one or more ESD protection circuitries 400 in FIG. 4. One or more ESD detection circuits 420 and one or more ESD power clamps 430 of the one or more ESD protection circuitries 400 in the interposer 130 are then electrically connected to the conductive network 510.

When an ESD event occurs on any one of the I/O ports 206 in the dies 110, 120 or the interposer 130, the corresponding ESD current is discharged to the conductive network of the ESD buses 440 in the dies 110 and 120 and the conductive network 510 in the interposer 130. One or more of the ESD detection circuits 420 in the dies 110, 120 and the interposer 130 detect the ESD event, and pull the respective conductive networks of the trigger buses 202 in the dies 110, 120 and the conductive network 510 in the interposer 130 to an active potential, for example, a VDD potential. As a result, all of the ESD power clamps 430 coupled between the ESD buses 440 and the VSS 208 in each of the dies 110, 120 and the interposer 130 are triggered substantially at the same time and turn on to discharge ESD current from the ESD buses 440 to the VSS 208 in the respective die.

Figure 6:
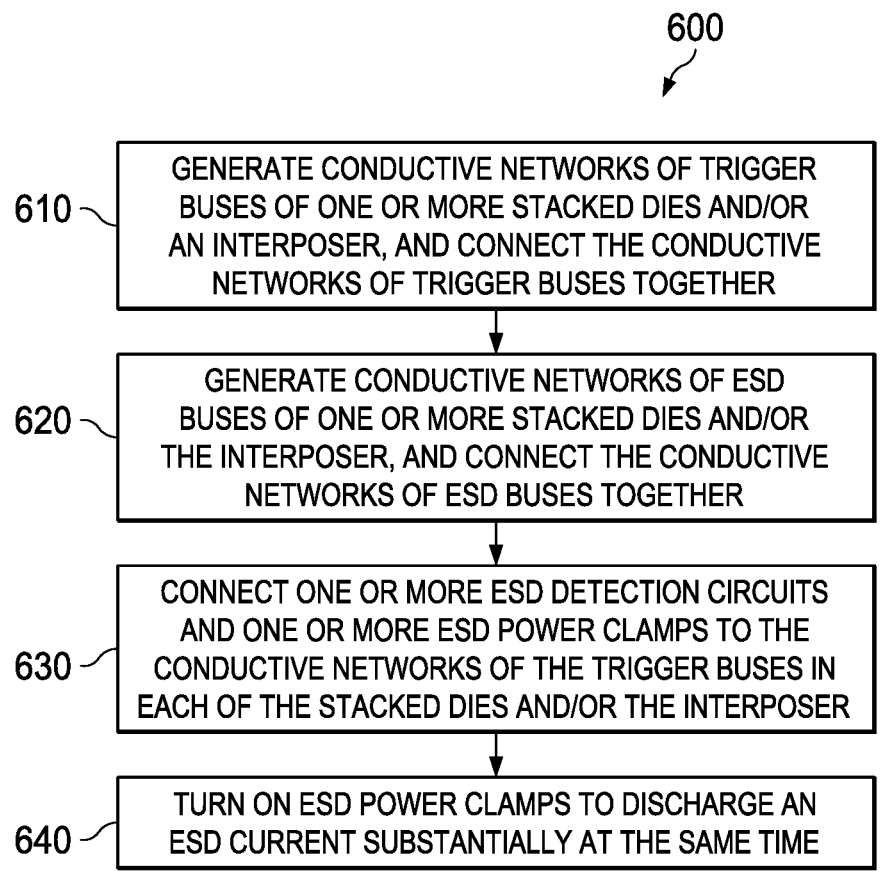
FIG. 6 is a flow chart 600 of a method of configuring ESD protection circuitries in FIG. 1-5 in accordance with some embodiments.

FIG. 6 is a flow chart 600 of a method of configuring ESD protection circuitries in FIG. 1-5 according to some example embodiments.

In operation 610, conductive networks of trigger buses of one or more stacked dies and/or an interposer are generated. Individual conductive networks of corresponding trigger buses are then electrically connected together. For example, each of the trigger buses 202 in dies 110, 120, and/or the interposer 130 in FIG. 3 is implemented as an individual conductive network to reduce parasitic resistance. The individual conductive networks of the corresponding trigger buses of the dies 110, 120 and/or the interposer 130 in FIG. 3 are then electrically connected together.

Any type of conductive networks of the trigger buses 202 in corresponding die 110, 120, and/or the interposer 130 in FIG. 3 is within the scope of various embodiments. In some embodiments, each of conductive networks is a mesh type network. In some embodiments, each of the conductive networks is a stripe type network. In some embodiments, each of the conductive networks is a combination of a mesh type and a stripe type network.

In operation 620, conductive networks of ESD buses of one or more stacked dies and/or an interposer are generated. Individual conductive networks of the ESD buses are then electrically connected together. For example, in some embodiments, each of the ESD buses 440 in dies 110, 120, and/or the interposer 130 in FIG. 5 is implemented as an individual conductive network to reduce parasitic resistance. The individual conductive networks of the ESD buses of the corresponding dies 110, 120 and/or the interposer 130 in FIG. 5 are then electrically connected together.

Any type of conductive networks of the ESD buses 440 in corresponding die 110, 120, and/or the interposer 130 in FIG. 5 is within the scope of various embodiments. In some embodiments, each of conductive networks is a mesh type network. In some embodiments, each of conductive networks is a stripe type network. In some embodiments, each of conductive networks is a combination of a mesh type and a stripe type network.

In operation 630, one or more ESD detection circuits and one or more ESD power clamps are electrically connected to the conductive network of the trigger buses in each of the stacked dies and/or the interposer. For example, one or more ESD detection circuits 220 and one or more ESD power clamps 230 in each of the corresponding dies 110, 120 and the interposer 130 in FIG. 3 are electrically connected to the conductive networks of the trigger buses 202 in each of the corresponding dies 110, 120 and the interposer 130 in FIG. 3. In some embodiments, the conductive networks of the trigger buses 202 of the dies 110 and 120 in FIG. 3 are electrically connected to the conductive network 310 of the interposer 130 in FIG. 3.

For another example, one or more ESD detection circuits 420 and one or more ESD power clamps 430 in each of the corresponding dies 110, 120 and the interposer 130 in FIG. 5 are electrically connected to conductive networks of trigger buses 202 in each of the corresponding dies 110, 120 and the interposer 130 in FIG. 5. In some embodiments, the conductive networks of the trigger buses 202 of the dies 110 and 120 in FIG. 5 are electrically connected to the conductive network of the trigger bus of the interposer 130 in FIG. 5.

In operation 640, after one or more ESD detection circuits detects an ESD event, the one or more ESD detection circuits cause the ESD power clamps to turn on substantially at the same time to discharge corresponding ESD current. For example, in FIG. 3, each of the dies 110, 120 and the interposer 130 include conductive networks of trigger buses 220 and the conductive network 310 respectively. The conductive networks of trigger buses 220 in the dies 110, 120 and the conductive network 310 in the interposer 130 are electrically connected together. A plurality of ESD detection circuits 220 and ESD power clamps 230 in the dies 110, 120 and/or the interposer 130 are electrically connected to the corresponding conductive networks of the trigger buses 220 and the conductive network 310. When one or more of the plurality of ESD detection circuits 220 detect an ESD event, the conductive networks of the trigger buses 220 in the corresponding dies 110, 120 and the conductive network 310 in the interposer 130 are pulled substantially at the same time to an active potential, for example, a VDD potential. As a result, all of the ESD power clamps 230 coupled to the conductive networks of the trigger buses 220 in the dies 110, 120 and the conductive network 310 in the interposer 130 are triggered substantially at the same time and are turned on substantially at the same time to discharge ESD current from the corresponding VDD 204 to the VSS 208 in the respective dies.

In some embodiments, an apparatus includes an interposer and a plurality of dies. The plurality of dies is stacked on the interposer. The interposer includes a first conductive network of a first trigger bus. Each of the plurality of dies includes a second conductive network of a second trigger bus. Each of the plurality of dies includes a first ESD detection circuit and a first ESD power clamp. The first ESD detection circuit and the first ESD power clamp are electrically connected between a first power line and a second power line, and are electrically connected to the second conductive network of the second trigger bus. The second conductive network of the second trigger bus in each of the plurality of dies is electrically connected to the first conductive network of the first trigger bus. When the first ESD detection circuit in one of the plurality of dies receives an input signal, the first ESD detection circuit is configured to generate an output signal to the first conductive network by way of the corresponding second conductive network of the second trigger bus to control the first ESD power clamps in each of the plurality of dies.

In some embodiments, an apparatus includes an interposer and a plurality of dies. The plurality of dies is stacked on the interposer. The interposer includes a first conductive network of a first trigger bus and a second conductive network of a first ESD bus. Each of the plurality of dies includes a third conductive network of a second trigger bus and a fourth conductive network of a second ESD bus. Each of the plurality of dies further includes a first ESD detection circuit and a first ESD power clamp. The first ESD detection circuit and the first ESD power clamp are electrically connected between the fourth conductive network of the second ESD bus and a first power line, and are electrically connected to the third conductive network of the second trigger bus. The third conductive network of the second trigger bus in each of the plurality of dies is electrically connected to the first conductive network of the first trigger bus. The fourth conductive network of the second ESD bus in each of the plurality of dies is electrically connected to the second conductive network of the first ESD bus. When the first ESD detection circuit in one of the plurality of dies receives an input signal, the first ESD detection circuit is configured to generate an output signal to the first conductive network of the first trigger bus by way of the corresponding third conductive network of the second trigger bus to control the first ESD power clamps in each of the plurality of dies.

In some embodiments, a method of configuring an integrated circuit includes connecting conductive networks of trigger buses of one or more stacked dies and/or an interposer together. The method also includes connecting one or more ESD detection circuits and one or more ESD power clamps to the conductive networks of the trigger buses in each of the stacked dies and/or the interposer.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. A method, comprising:
connecting trigger buses of one or more dies and an interposer together; and
connecting one or more ESD detection circuits and two or more ESD power clamps to trigger buses in each die and/or the interposer, wherein the interposer includes at least one of the ESD power clamps, wherein at least one of the ESD power clamps is coupled between a VSS and a VDD, and wherein at least one of the ESD power clamps is coupled between a first ESD bus and the VDD.

2. The method of claim 1, further comprising providing a discrete conductive network for corresponding ESD buses of one or more dies and/or the interposer, and connecting conductive networks of ESD buses together, wherein the trigger buses of one or more dies and the interposer are connected by conductive networks of the trigger buses.

3. The method of claim 2, wherein conductive networks of the trigger buses or discrete conductive networks of ESD buses comprise a mesh type network or a stripe type network.

4. The method of claim 2, further comprising the one or more ESD detection circuits causing the ESD power clamps to turn on in each die and/or the interposer to discharge an ESD current at substantially a same time.

5. The method of claim 1, further comprising providing one or more ESD detection circuits and one or more ESD power clamps in each of the one or more dies and/or the interposer, and connecting the one or more ESD detection circuits and the one or more ESD power clamps to the trigger buses.

6. A device, comprising:
an interposer, the interposer comprising a first ESD power clamp and a first trigger bus; and
a plurality of dies on the interposer, the plurality of dies comprising a second trigger bus, the second trigger bus electrically connected to the first trigger bus, wherein each die includes a first ESD detection circuit and a second ESD power clamp, the first ESD detection circuit and the second ESD power clamp electrically connected between a first power line and a second power line, the first ESD detection circuit and the second ESD power clamp electrically connected to the second trigger bus, wherein the first ESD detection circuit is configured to generate an output signal to the first trigger bus, by way of a corresponding second trigger bus, to control the second ESD power clamps in each die, wherein the first ESD power clamp is electrically connected between a third power line and a fourth power line, and is electrically connected to the first trigger bus.

7. The device of claim 6, wherein the interposer comprises a first conductive network of the first trigger bus.

8. The device of claim 7, wherein each die comprises a second conductive network of the second trigger bus.

9. The device of claim 8, wherein the second conductive network comprises a mesh type network or a stripe type network.

10. The device of claim 8, wherein the interposer includes a second ESD detection circuit and a third ESD power clamp, the second ESD detection circuit electrically connected between the third power line and the fourth power line, and electrically connected to the first conductive network of the first trigger bus, the third ESD power clamp electrically connected between the first power line and the second power line.

11. The device of claim 10, wherein the first and the second conductive networks are configured to trigger the second ESD power clamp in each die and the first ESD power clamp in the interposer to discharge ESD current from the first power line to the second power line, and from the third power line to the fourth power line respectively.

12. The device of claim 7, wherein the first conductive network comprises a mesh type network or a stripe type network.

13. A method, comprising:
providing an interposer having a first conductive network of a first trigger bus and a second conductive network of a first ESD bus; and
attaching a plurality of dies to the interposer;
wherein:
each of the plurality of dies includes;
a third conductive network of a second trigger bus and a fourth conductive network of a second ESD bus; and
a first ESD detection circuit and a first ESD power clamp; and
the first ESD detection circuit and the first ESD power clamp are electrically connected between the fourth conductive network of the second ESD bus and a first power line, and the third conductive network of the second trigger bus.

14. The method of claim 13, wherein:
the third conductive network of the second trigger bus in each of the plurality of dies is electrically connected to the first conductive network of the first trigger bus; and
the fourth conductive network of the second ESD bus in each of the plurality of dies is electrically connected to the second conductive network of the first ESD bus.

15. The method of claim 14, further comprising the first ESD detection circuit in one of the plurality of dies receiving an input signal, the first ESD detection circuit generating an output signal to the first conductive network of the first trigger bus, by way of a corresponding third conductive network of the second trigger bus, to control the first ESD power clamps in each of the plurality of dies.

16. The method of claim 14, wherein at least one of:
the first conductive network of the first trigger bus or the third conductive network of the second trigger bus comprises a mesh type network or a stripe type network; or
the second conductive network of the first ESD bus or the fourth conductive network of the second ESD bus comprises a mesh type network or a stripe type network.

17. The method of claim 14, wherein each of the plurality of dies further includes another ESD power clamp connected between the first power line and a second power line, and connected to the third conductive network of the second trigger bus.

18. The method of claim 13, wherein the interposer includes a second ESD detection circuit and a second ESD power clamp, the second ESD detection circuit and the second ESD power clamp are electrically connected between the second conductive network of the first ESD bus and a third power line, and are electrically connected to the first conductive network of the first trigger bus.

19. The method of claim 18, further comprising the first and the third conductive networks triggering the first ESD power clamps in each of the plurality of dies and the second ESD power clamp in the interposer to discharge ESD current from the fourth conductive network of the second ESD bus to the first power line, and from the second conductive network of the first ESD bus to the third power line respectively.

20. The method of claim 13, wherein the interposer further includes another ESD power clamp connected between a third power line and a fourth power line, and connected to the first conductive network of the first trigger bus.

\* \* \* \* \*